(12) United States Patent
Howard

(10) Patent No.: US 8,063,698 B2
(45) Date of Patent: Nov. 22, 2011

(54) BYPASSING AMPLIFICATION

(75) Inventor: Damian Howard, Winchester, MA (US)

(73) Assignee: Bose Corporation, Framingham, MA (US)

( * ) Notice: Subject to any disclaimer, the term of this patent is extended or adjusted under 35 U.S.C. 154(b) by 873 days.

(21) Appl. No.: 12/114,256

(22) Filed: May 2, 2008

(65) Prior Publication Data
US 2009/0273387 A1    Nov. 5, 2009

(51) Int. Cl.
*H03F 1/14* (2006.01)
(52) U.S. Cl. .......... 330/51; 330/307; 381/59; 455/226.1
(58) Field of Classification Search ............. 330/51, 330/307; 381/59; 455/226.1
See application file for complete search history.

(56) References Cited

U.S. PATENT DOCUMENTS

| | | | |
|---|---|---|---|
| 3,045,180 A | 7/1962 | Losher | |
| 3,467,867 A | 9/1969 | Armes | |
| 3,609,562 A | 9/1971 | Granata et al. | |
| 4,752,959 A | 6/1988 | Matsumoto et al. | |
| 5,066,919 A | 11/1991 | Klassen et al. | |
| 5,450,624 A | 9/1995 | Porambo et al. | |
| 5,568,525 A | 10/1996 | de Nijs et al. | |
| 5,751,148 A | 5/1998 | Kennedy et al. | |
| 5,815,584 A | 9/1998 | Whitecar et al. | |
| 5,983,087 A | 11/1999 | Milne et al. | |
| 6,289,292 B1 | 9/2001 | Charlton et al. | |
| 6,346,876 B1 | 2/2002 | Flick | |
| 6,359,987 B1 | 3/2002 | Tran et al. | |
| 6,369,649 B2 * | 4/2002 | Nakajima | 330/51 |
| 6,804,565 B2 | 10/2004 | Eid | |
| 6,806,768 B2 * | 10/2004 | Klaren et al. | 330/124 R |
| 6,870,934 B2 | 3/2005 | Krochmal et al. | |
| 7,046,974 B2 * | 5/2006 | Yamaguchi | 455/127.1 |
| 7,079,825 B2 * | 7/2006 | Wieck | 455/234.1 |
| 7,167,515 B2 | 1/2007 | Kelly et al. | |
| 7,215,784 B1 | 5/2007 | Pham et al. | |
| 7,379,714 B2 * | 5/2008 | Haque et al. | 455/107 |
| 7,679,441 B2 * | 3/2010 | Yoshii | 330/151 |
| 7,880,538 B2 * | 2/2011 | Sharma | 330/9 |
| 7,898,325 B2 * | 3/2011 | Hasan Abrar | 330/51 |
| 2004/0114771 A1 | 6/2004 | Vaughan et al. | |
| 2005/0175195 A1 | 8/2005 | Cheney et al. | |
| 2006/0241797 A1 | 10/2006 | Craig et al. | |
| 2007/0025559 A1 | 2/2007 | Mihelich et al. | |

FOREIGN PATENT DOCUMENTS

| | | |
|---|---|---|
| EP | 1657962 A2 | 5/2006 |
| EP | 1786241 | 5/2007 |
| WO | 98/05150 | 5/1999 |
| WO | 04001552 A2 | 12/2003 |

OTHER PUBLICATIONS

Brennan, Sean, Measuring a Loudspeaker Impedance Profile Using the AD5933, Analog Devices, One Technology Way, PO Box 9106 Norwood, MA, Rev. A, pp. 12, 06/07.

Invitation to Pay Additional Fees and, Where Applicable, Protest Fee, Issued Jun. 25, 2009 for International Application No. PCT/US2009/036778, filed Mar. 11, 2009.

International Search Report and Written Opinion for PCT/US2009/036778, dated Nov. 2, 2009.

* cited by examiner

*Primary Examiner* — Patricia Nguyen

(57) ABSTRACT

An integrated circuit includes a power amplification circuit and a switch circuit wherein the switch circuit is coupled to an output of the power amplification circuit, a bypass input, and a control input, such that the switch selectively couples the power amplification circuit output or the bypass input to an output of the integrated circuit.

1 Claim, 11 Drawing Sheets

BYPASSING AMPLIFICATION

SUMMARY

In general, in one aspect, a detecting circuit measures at least one response characteristic of an output channel in an electro-acoustic transducer system, a memory stores a plurality of equalizations, each equalization corresponding to a known electro-acoustic transducer system associated with at least one response characteristic stored in the memory, and a processor in communication with the detecting circuit and the memory includes executable instructions to select one of the stored response characteristics matching the response characteristic measured by the detecting circuit.

Implementations may include one or more of the following features.

The detecting circuit, memory, and processor are included in an amplifier assembly or a head unit. The response characteristic is an electrical impedance response characteristic. The detecting circuit includes a microphone. The detecting circuit includes an impedance to digital converter, and a first switch coupled to the impedance to digital converter and to the output channel and under the control of the processor to selectively couple the impedance to digital converter to the output channel in place of an amplification circuit. The first switch is provided by a portion of an integrated circuit that also provides the amplification circuit. The impedance to digital converter is provided by circuitry of the processor under the control of executable instructions. The detecting circuit also includes a second switch under the control of the processor to selectively couple the impedance to digital converter to a calibration resistor. A second output channel and a second switch are included, and the second switch selectively couples the detecting circuit to the second output channel in place of an unamplified signal source.

The executable instructions cause the processor to control the impedance to digital converter, current source, first switch, and second switch to provide a first test signal over a range of frequencies through the second switch to the calibration resistor, measure the complex impedance of the resistor, and output digital values of the magnitude and phase of the complex impedance of the resistor at each of the frequencies of the range, provide a second test signal over the range of frequencies through the first switch to the output channel, measure the complex impedance of the output channel, and output digital values of the magnitude and phase of the complex impedance of the output channel at each of the frequencies of the range, and combine the magnitude and phase of the complex impedance of the resistor with the magnitude and phase of the complex impedance of the output channel to compute the response characteristic of the output channel. The executable instructions cause the processor to select the stored response characteristic by computing a variation of each of a magnitude and phase of a complex frequency response of the output channel from a magnitude and phase of each of one or more of the stored response characteristics. Computing the variation and selecting the stored response characteristic uses a statistical algorithm. The statistical algorithm is a modified Reduced Chi-square Goodness of Fit Test algorithm. Computing the variation includes computing a Chi-square value for each of the magnitude and phase of the measured response of the output channel as compared to each of the one or more of the stored response characteristics. Selecting the stored response characteristic includes identifying one of the stored response characteristics for which the Chi-square values of both the magnitude and phase for the measured response of the output channel are less than respective magnitude and phase Chi-square limits associated with the stored response characteristic. Selecting the stored response characteristic includes identifying one of the stored response characteristics for which the sum of the chi-square values for the magnitude and phase of the measured response of the first channel is a minimum compared to all other candidates. At least one of the plurality of equalizations include equalization coefficients for application to signals from an input electro-acoustic transducer. The executable instructions cause the processor to select and apply a stored graphical configurations based on the match between the response characteristic and the stored characteristics.

In general, in one aspect, a plurality of loudspeakers are equalized by measuring a response characteristic of an output channel of an electro-acoustic transducer system, determining whether the measured response characteristic matches at least one stored response characteristic in a memory to find a matched response characteristic, and selecting an equalization corresponding to a known electro-acoustic transducer system based on the matched response characteristic.

Implementations may include one or more of the following features. Measuring a second response characteristic of a second output channel of the electro-acoustic transducer system, and selecting the equalization includes identifying a set of response characteristics in the memory associated with a vehicle model and corresponding to the measured response characteristics of the first and second output channels in combination. Selecting the equalization also includes determining that no set of response characteristics in the memory associated with any vehicle model corresponds to the measured response characteristics of the first and second output channels in combination, determining whether each of the first and second output channels response characteristics individually matches a stored response characteristic in the memory, and selecting an equalization for each of the first and second transducer systems based on the individually matched response characteristics. Selecting the equalization includes presenting a menu of vehicle models corresponding to the known electro-acoustic transducer system and prompting a user to select one of the models. Measuring an acoustic transfer function of the vehicle, and determining whether the measured acoustic transfer function matches at least one stored acoustic transfer function in the memory to find a matched acoustic transfer function, where measuring the response characteristic of the output channel includes measuring an electrical impedance response of the channel, and selecting the equalization includes identifying the electro-acoustic transducer system based on the electrical impedance response, identifying an acoustic environment based on the matched acoustic transfer function, and selecting an equalization corresponding to use of the identified electro-acoustic transducer system in the identified acoustic environment.

In general, in one aspect, an electro-acoustic transducer system is identified by measuring a complex frequency response of the transducer system, computing a variation of a magnitude and phase of the measured response from a magnitude and phase of each of one or more of the stored response characteristics, and selecting one of the stored response characteristics as corresponding to the measured response, the selected response characteristic being associated with a known electro-acoustic transducer system.

Implementations may include one or more of the following features. The complex frequency response includes a complex impedance measurement. The complex frequency response includes an acoustic transfer function. The determining uses a modified Reduced Chi-square Goodness of Fit Test algorithm. Computing the variation includes computing a chi-square value for the magnitude and phase of the measured response of the first channel compared to each of the one or more of the stored response characteristics. The selecting includes identifying one of the stored response characteristics for which the Chi-square value of both the magnitude and phase of the measured response are less than respective magnitude and phase Chi-square limits associated with the stored response characteristic. The selecting includes selecting the one of the stored response characteristics for which the sum of the Chi-square values of the magnitude and phase of the measured response is a minimum compared to all other candidates. Measuring the response includes applying a signal at each of a series of frequencies within a defined band of frequencies and measuring the response of the electro-acoustic transducer system for each of the frequencies. Measuring the response also includes applying the signal and measuring the response repeatedly for each of a series of defined bands of frequencies. Measuring the response also includes comparing the measured response at each frequency to a response measured when the signal is applied to a known impedance. Measuring the response includes applying the signal and measuring the response repeatedly for each of a set of signal power levels.

In general, in one aspect, a transducer system is diagnosed by measuring a response characteristic of an electro-acoustic transducer system, determining whether the response characteristic matches at least one stored response characteristic in a memory and associated with a known electro-acoustic transducer system or with a known state of an electro-acoustic transducer system, and reporting a diagnostic state of the electro-acoustic transducer system based on the determining.

In general, in one aspect, an integrated circuit includes a power amplification circuit and a switch circuit wherein the switch circuit is coupled to an output of the power amplification circuit, a bypass input, and a control input, such that the switch selectively couples the power amplification circuit output or the bypass input to an output of the integrated circuit.

In some examples, the integrated circuit includes a current source coupled to the bypass input a calibration resistor, and a second switch coupled to the current source, the calibration resistor, and a second control input such that the second switch selectively couples the current source to the calibration resistor.

DETAILED DESCRIPTION

When an entertainment system is installed, it is useful for certain components to know which other components are present. For example, a signal processor in the amplifier of an entertainment system may use one of several pre-programmed signal-processing configurations based on the type and number of output electro-acoustic transducers included in the entertainment system. This can be advantageous, for example, if a single amplifier is to be installed in a variety of different vehicle models and has a different pre-programmed signal-processing configuration for each model. Upon being installed, the amplifier identifies which model it has been installed into and loads the appropriate configuration. This can also be used to load vehicle-model-specific signal processing routines to be used on signals from an input electro-acoustic transducer, e.g., from a microphone installed in the vehicle for receiving voice commands. In some examples, other features are also customized when the vehicle model has been determined, such as lighting options and choice of display graphics. For example, if cars of one brand use red lighting for their instruments, and cars of another use green, an after-market entertainment system head unit that identifies what car it is in based on the electro-acoustic transducers of the audio system adjusts its own lighting color scheme to match that of the brand of the car. Other display graphics to be modified include introductory screens, brand labels, or the particular icons used for different features. In the case of a home entertainment system, the user connect multiple components, and it is useful for one or more of the components to confirm that the other components are correctly connected.

In some examples, the system also detects whether the electro-acoustic transducers in the vehicle are installed in the configuration expected for the model, for example, that they have been installed correctly or that they have not been modified from their factory configuration. Uses of such a system include reducing the number of unique components that must be stocked in a factory that makes more than one model of vehicle, and providing aftermarket systems that are pre-tuned by their manufacturer to provide optimal signal processing for the stock electro-acoustic transducers in each of several potential vehicle models. Additionally, in some examples, the amplifier is used for diagnostics, such as to determine whether and identify which of the electro-acoustic transducers or electro-acoustic transducer housings are damaged or determine whether the proper electro-acoustic transducers have been installed in a particular model of vehicle to reduce manufacturing errors and related costs.

Figure 1A:
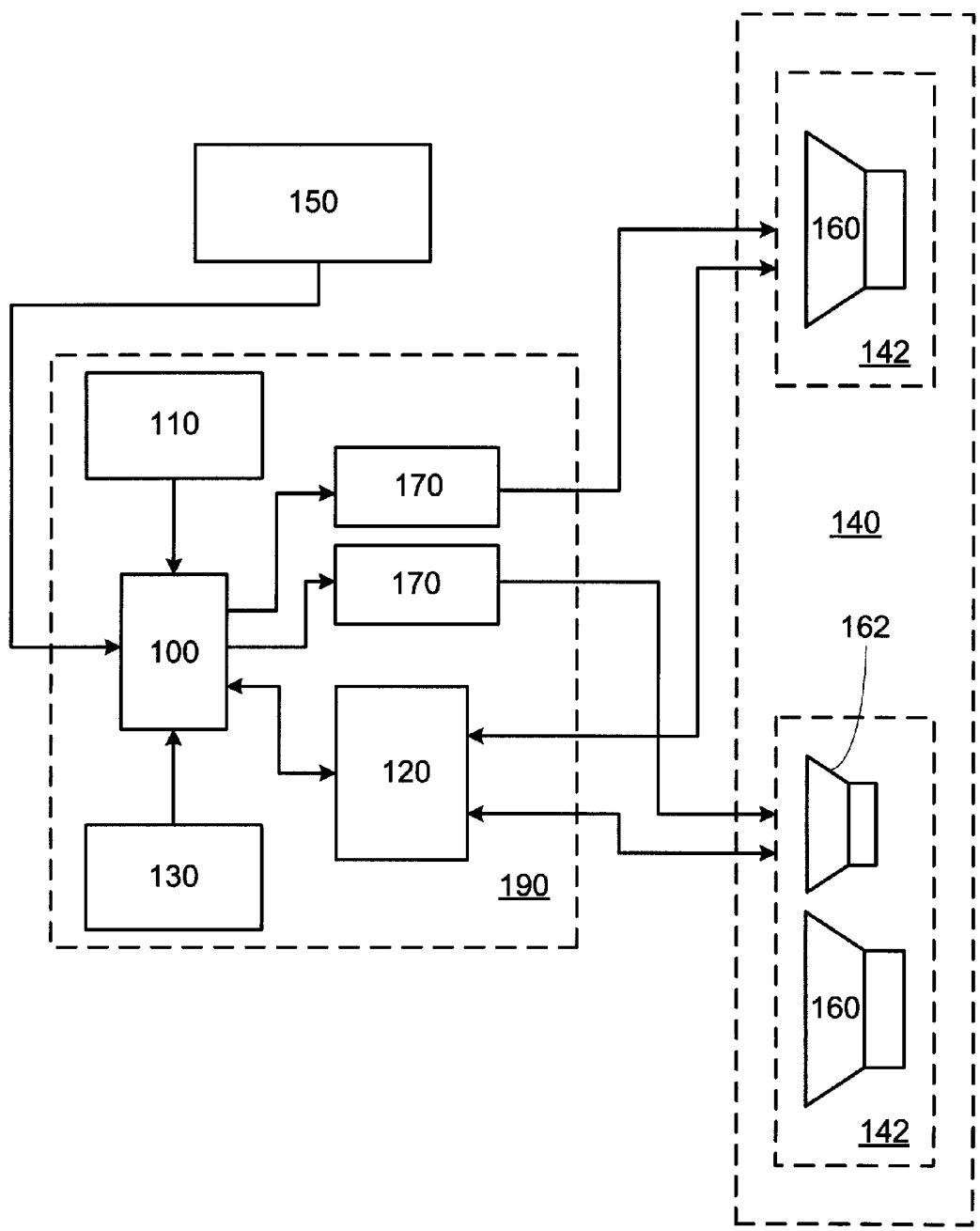
FIGS. 1A and 3-5 are a block diagrams of entertainment systems.

In one example, shown in FIG. 1A, an entertainment system includes a processor 100 that controls various aspects of the entertainment system, including signal processing of audio signals. The processor 100 is coupled to a user interface 130, a source 150 that provides signals for playback through the entertainment system, a memory 110, one or more amplification circuits 170 and a detecting circuit 120. In another example, a multiplexer couples the processor 100 to multiple sources 150. Each amplification circuit 170 is coupled to a channel 142 in an electro-acoustic transducer system 140. By transducer system, we refer to a set of electro-acoustic transducers supplied with signals by one or more channels. Each channel supplies signals to one or more of the electro-acoustic transducers. For example, in many cars, four channels are provided, corresponding to the front left, front right, rear left, and rear right areas of the passenger compartment. In some cars, additional channels provide audio signals from side or center positions. When one position has multiple transducers, such as a tweeter and woofer, these may be provided by one channel driving both transducers or by separate channels for each transducer. The number of channels in the transducer system does not necessarily correspond to the number of channels provided by an audio source. Two-channel (e.g., stereo) audio may be played back over any number of channels, and multi-channel (e.g., 5.1 channel surround sound) audio may be played back over more or fewer playback channels than the number of channels in the source. Dividing the signals between channels can be accomplished with passive crossover networks or within an active circuit, such as an active crossover network or a digital signal processor, and can be carried out before or after amplification. In some examples, the equalization selected by the described system includes instructions about how to distribute audio signals amongst the playback channels. In the example of FIG. 1, the electro-acoustic transducer system 140 includes two channels 142, one with one electro-acoustic transducer 160 and one with two electro-acoustic transducers 160 and 162.

Figure 3:
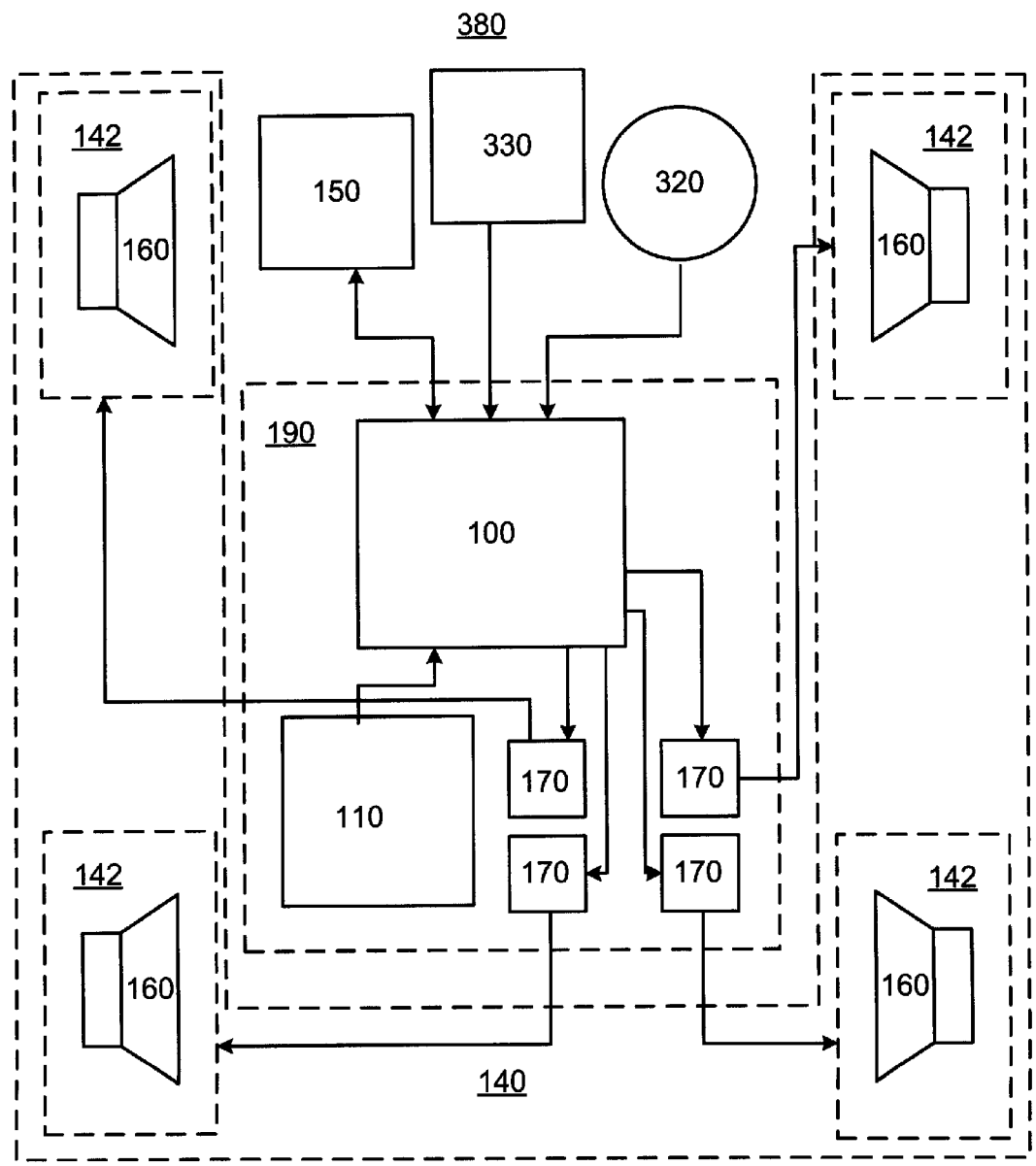

The detecting circuit 120 is coupled to one or more of the channels 142. In another example, as shown in FIG. 3, the processor 100 is coupled to an input electro-acoustic transducer 320, for example, a hands-free microphone for use in a communications system 330. The connections between components may be unidirectional or bi-directional, depending on the nature of the data or signals to be exchanged. In the example shown in FIG. 1A, the connections between the processor 100, the detecting circuit 120, the source 150, and between the detecting circuit 120 and the one or more channels 142 are bi-directional. In some examples, the processor 100, the memory 110, the detecting circuit 120, the amplification circuits 170 and some aspects of the user interface 130 are housed within an amplifier 190. In another example, the processor, the memory, the detecting circuit, the source and some aspects of the user interface are housed within a head unit, a self-contained electronic unit installed within the vehicle, typically including a user interface, media (tape, CD) readers, and a radio tuner. In a further example, the amplification circuits are also housed within the head unit. In another example, the processor, the memory, the detecting circuit, and the amplification circuits are housed within a housing installed remotely in the vehicle and some aspects of the user interface are housed in a separate control panel accessible to a user. In another example, one or more of the amplification circuits 170 are located at the site of or integrated into one or more of the transducers 160, as described in U.S. Pat. No. 7,350,066. In this case, the detecting circuit 120 can be located at the location of the processor 100, at the location of the transducer, or split between them.

Upon installation in a vehicle, the processor 100 uses the detecting circuit 120 to determine a response characteristic of the one or more electro-acoustic transducers 160 and 162 in each channel 142. The processor 100 receives measurements from the detecting circuit 120 uses the measurements to compute a measured response characteristic. The processor then determines whether the measured response characteristic matches at least one stored response characteristic. By "match," we mean that the measured and stored response characteristics have some attribute in common. The attribute may be the data representing the response characteristics themselves—that is, the response characteristics are the same, within some threshold, as described below—or the attribute may be some signature that characterizes the response characteristics, like a resonant frequency and the impedance at that frequency. The attribute is selected to allow accurate matching of measured systems to known systems. Each stored response characteristic corresponds to a known set of one or more electro-acoustic transducers in a channel. This matching allows the processor to identify the electro-acoustic transducers. From the combination of channels present in the transducer system 140 and the identity of the transducers in each channel, the processor 100 identifies the vehicle in which it is installed. In some examples, identifying the vehicle is based on a direct match of each channel's measured response characteristic to a stored response characteristic, for a known combination of channels. In some examples, identifying the vehicle is based on relationships between the channels. Based on this identification, the processor selects one of several equalizations stored in the memory 110 to equalize a set of signals from the source 150 when applying one or more of those signals to each channel 142 through the amplification circuits 170. In another example, the processor 100 selects one of the several equalizations to equalize a signal from the hands-free microphone when applying that signal to the communication system. Each equalization corresponds to at least one stored response characteristic and may have one or more equalization coefficients applicable, for example, to different frequency ranges. Sets of equalizations correspond to one or more vehicle models, with the set of equalizations for a given vehicle model including a set of equalization coefficients for each channel in that model. In some examples, the equalization coefficients include echo cancellation coefficients and noise reduction coefficients for both the electro-acoustic transducer system and the hands-free microphone. The same detecting circuit may be used to identify the transducers used in a home entertainment system, though additional steps may be necessary to determine equalization parameters, as the arrangement of transducers is not controlled as it is in a vehicle. U.S. patent application Ser. No. 10/105,206 describes one such system for tuning an entertainment system for a particular listening environment where the location of the transducers is not known ahead of time.

In one example, the user interface 130 indicates whether the entertainment system has been successfully installed or configured. In another example, when the vehicle is identified, the equalization is permanently selected and the user is notified that the entertainment system has been properly configured. In another example, where the processor 100 determines there is no match between the measured response on at least one channel and any known set of transducers, or between the identified sets of transducers and any known vehicle, the user is notified that the entertainment system has not been properly configured and the configuration sequence is terminated. In another example, where the processor 100 determines that there is no match, a standard equalization (for example, no equalization, a flat equalization, or some typical equalization) is selected. In another example, for certain attributes of the measured responses, the user is notified that a particular set of one or more electro-acoustic transducers in a channel may be damaged. In some examples, differences between the response of a damaged transducer and the nature of the response of an unknown but undamaged transducer allow the system to distinguish between the two. In some examples, where an unknown transducer is unlikely to be present, such as an assembly line where all available transducers are known, damage is indicated for any failure to match the measured response to a known response. In still another example, the processor detects and notifies the user of a damaged transducer housing. For example, a transducer tested at multiple power levels, as described below, may match a known response at all power levels except the highest, at which point the response changes significantly, indicating that the transducer may be hitting something, i.e., a damaged housing. Various combinations of these results can be used together, depending, for example, on the intended use of the entertainment system and the expected skill and resources of the person installing it.

Figure 1B:
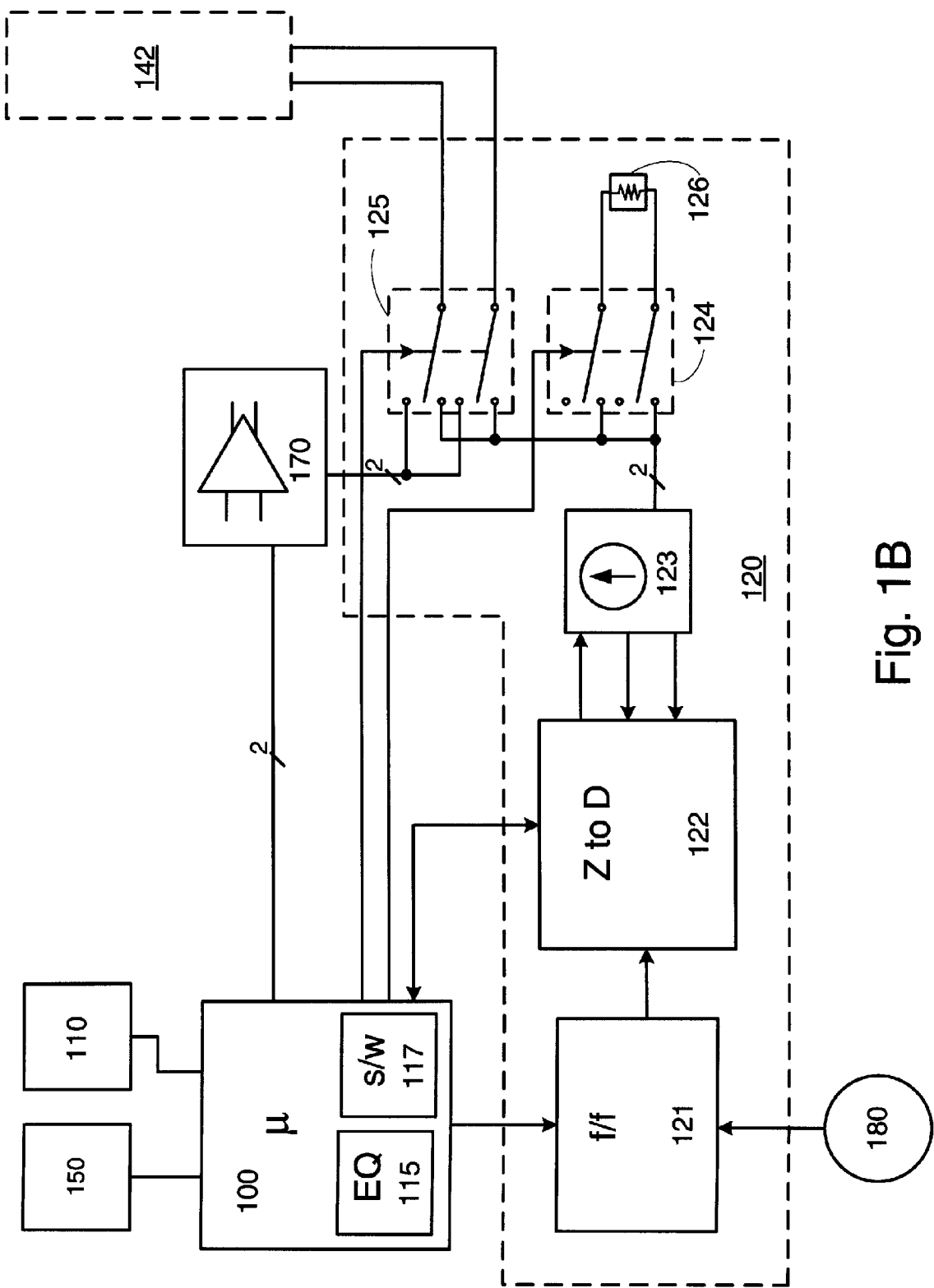
FIGS. 1B-1E are block diagrams of examples of the detecting circuit in FIG. 1A.

To identify the set of one or more electro-acoustic transducers 160 and 162 in each channel 142, the detecting circuit 120 measures the complex impedance of the channel over a range of frequencies, for example, the full range of the audible spectrum. In some examples, the detecting circuit includes multiple components, several of which are separately coupled to the processor 100. For example, as shown in FIG. 1B, the detecting circuit 120 includes a frequency divider 121, an impedance to digital converter 122, a current source 123, a calibration resistor 126 and switches 124 and 125, each switch controlled by the processor 100. In some examples, the frequency divider 121 is implemented by combining a binary counter and a multiplexer (mux). The divider receives a square wave from the clock 180 and divides it by a value controlled by the processor 100 through the mux control input. The divided signal is a reference clock for the impedance to digital converter 122, and is shifted to a value appropriate for the range of frequencies at which the impedance is to be measured, as described below. The impedance to digital converter 122, such as an AD5933 from Analog Devices, generates a sinusoid using the reference clock from the frequency divider 121 and commands from the processor 100. The AD5933, in particular, uses a 27-bit direct digital synthesis core and a digital to analog converter (DAC) to generate the sinusoid. The AD5933 measures the current through the load with an analog to digital converter (ADC) and puts the data through a single-point discrete Fourier transform (DFT) to deliver the complex impedance at the specified frequency. In some examples, this signal generation and impedance calculation is carried out within the processor 100, as described below.

The current source 123 modifies the sinusoidal measurement signal outputted from the impedance to digital converter 122 to aid in the measurement of nominal impedances. For example, where the impedance to digital converter 122 is configured to measure an impedance of 100Ω to 10 MΩ, the lower bound is limited by the output impedance of the impedance to digital converter 122 itself. The bounds of the output impedance of the impedance to digital converter may be lowered by using a modified Howland current source to generate the excitation signal and the load presented by the channel as feedback impedance in a transimpedance amplifier. The switches 124 and 125 may be relays or any other switching circuit, such as logic-controlled switches or transistors. In some examples, high current levels are needed, for which MOSFETs are particularly suitable. References to switches or relays refer to any suitable switching device. The frequency divider 121 is coupled to the impedance to digital converter 122 and to a clock 180. The impedance to digital converter 122 is coupled to a current source 123, which in turn is coupled to one set of inputs for each of the switches 124 and 125. The first switch 124 has its load terminals coupled to the calibration resistor 126, while the second switch 125 has a second set of input terminals coupled to at least one of the amplification circuits 170 and its load terminals coupled to the channel 142. The processor uses software or firmware 117 to identify the channel and loads an appropriate equalization 115 from the memory 110. When the detecting circuit 120 is not being used to evaluate one or more of the channels 142, each switch 125 couples the audio signal from a corresponding amplification circuit 170 (provided to the amplification circuit 170 by the processor 100) to a corresponding channel 142 for playback of audio signals.

Figure 1C:
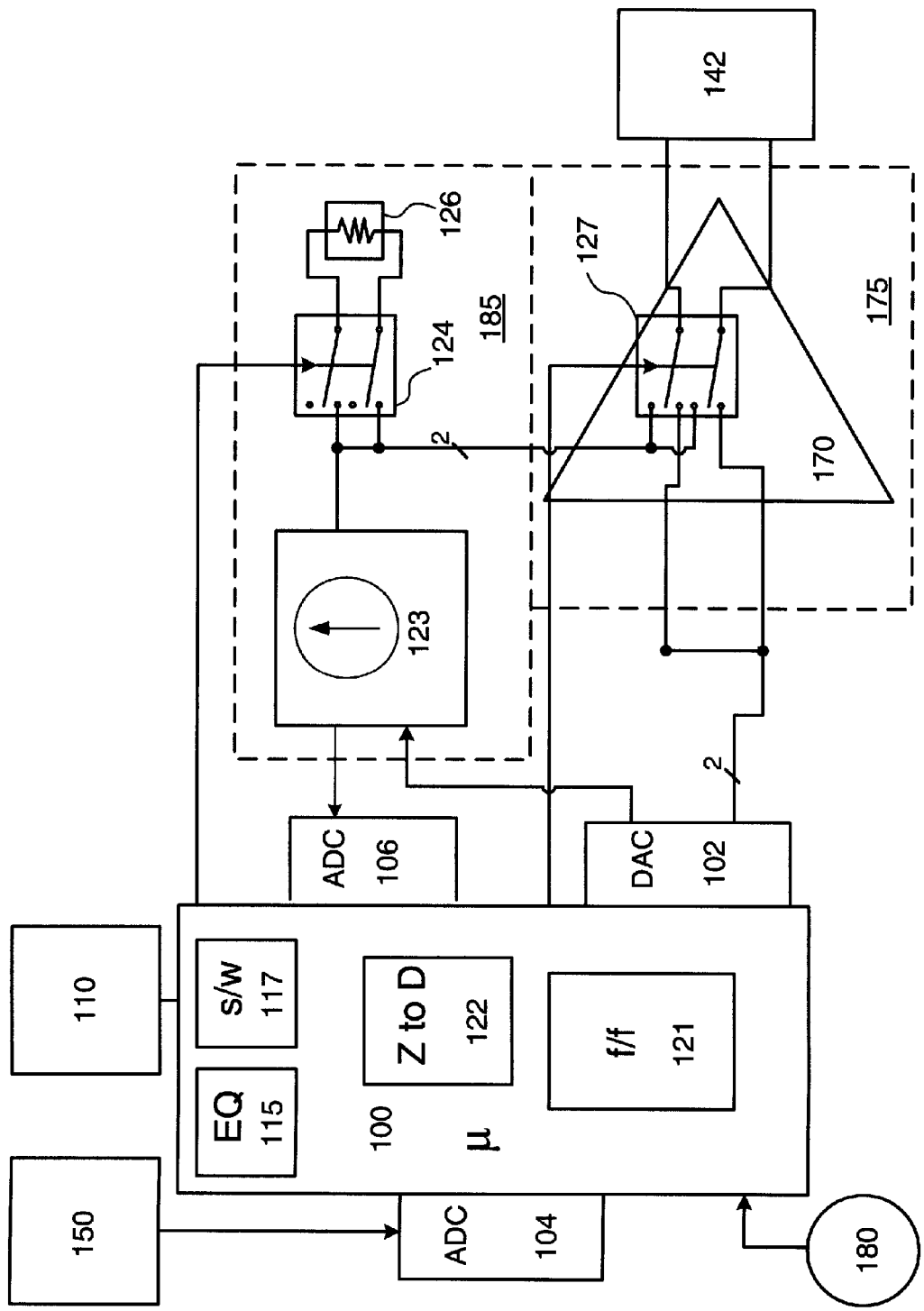

In some examples, as shown in FIG. 1C, the elements of the detecting circuit 120 are incorporated into the other integrated circuits, decreasing the number of extra parts that are needed as compared to a standard audio processing and amplifying system. In the example of FIG. 1C, the frequency divider 121 and the impedance detector 122 are incorporated into the processor 100. In another example, the processor 100 incorporates an integrated clock in place of the external clock 180. The processor 100 is coupled to one or more analog to digital (ADC) converters 104 and 106 and a digital to analog converter (DAC) 102, any of which may also be incorporated into the processor. The ADC 104 couples the source 150 to the processor and may be omitted if the source 150 provides digital signals directly. The DAC 102 couples the processor to the current source 123 to control the frequency and level of the test signal. The processor is also coupled to the amplification circuit 175 (explained below) through the same or an additional DAC 102.

To further simplify the sensing circuit, the switch 125 is incorporated into the amplification circuit 170 as a bypass switch 127 to form an integrated amplifier-switch IC 175. This provides the amplification circuit with a built-in, non-amplified bypass to couple the load directly to the current source 123 or some other circuitry without a virtual impedance from the amplification circuit 170 compromising measurements made through the bypass. In some examples, one or more of the current source 123, switch 124, and calibration resistor 126 are also incorporated into the amplifier-switch IC 175. The current source, switch, and resistor may also be incorporated into a separate integrated circuit 185 or into the processor 100. With this arrangement, the amplifier-switch portion of the IC 175 receives audio signals and control signals from the processor 100 and receives or internally generates test signals from the current source 123. The integrated switch 127 couples either the test signals or the amplified audio signals to the transducer 142, according to the control signal. For the calibration steps of the process (explained below), the switch 124 couples the test signals to the calibration resistor 126. Feedback from the current source 123 is communicated to the integrated impedance detector 122 through the analog to digital converter 106. Any combination of integrated and discrete components may be used, depending on the capabilities of the processor and amplifier and the needs of a particular system.

Figure 1D:
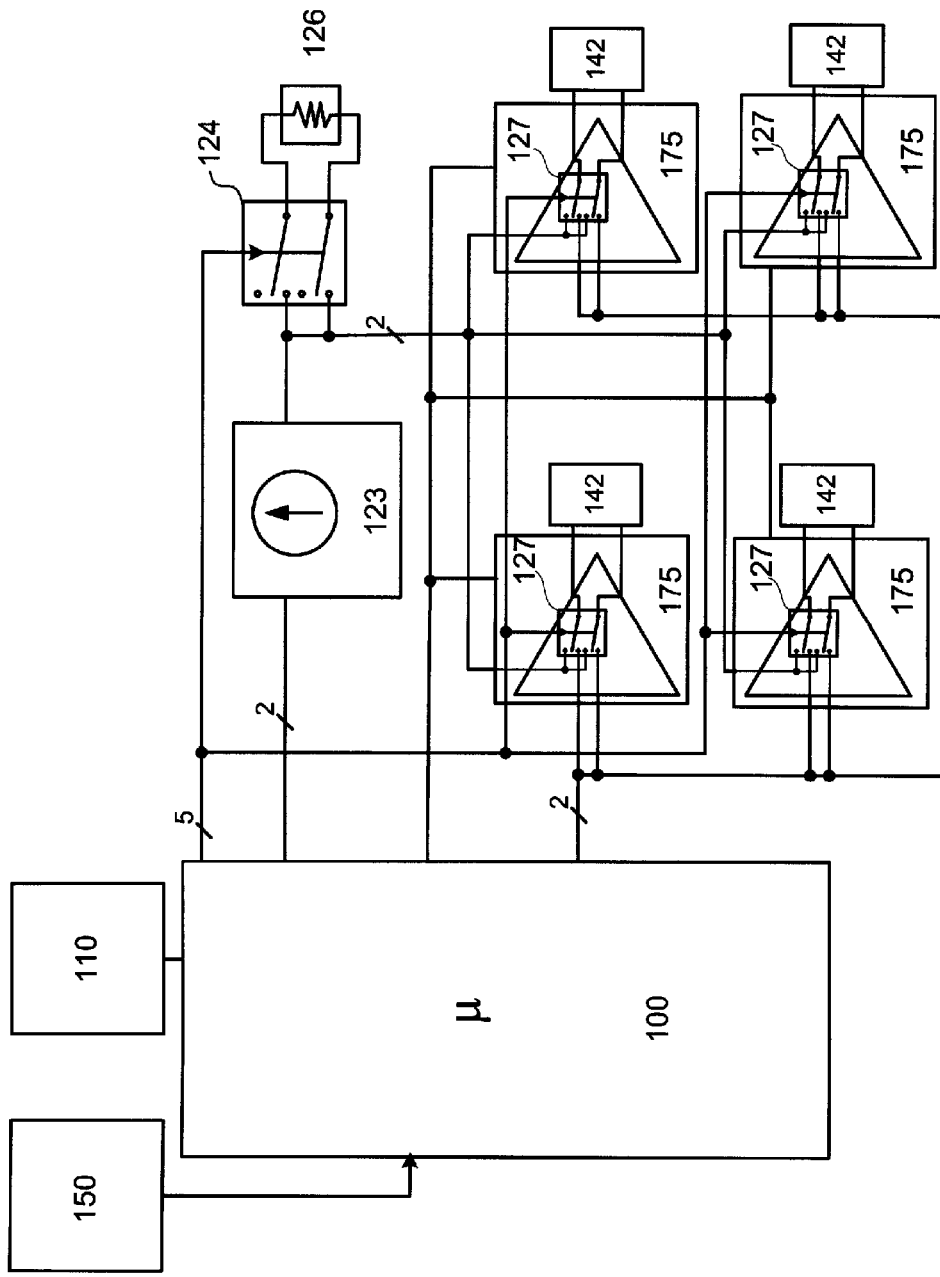
Figure 1E:
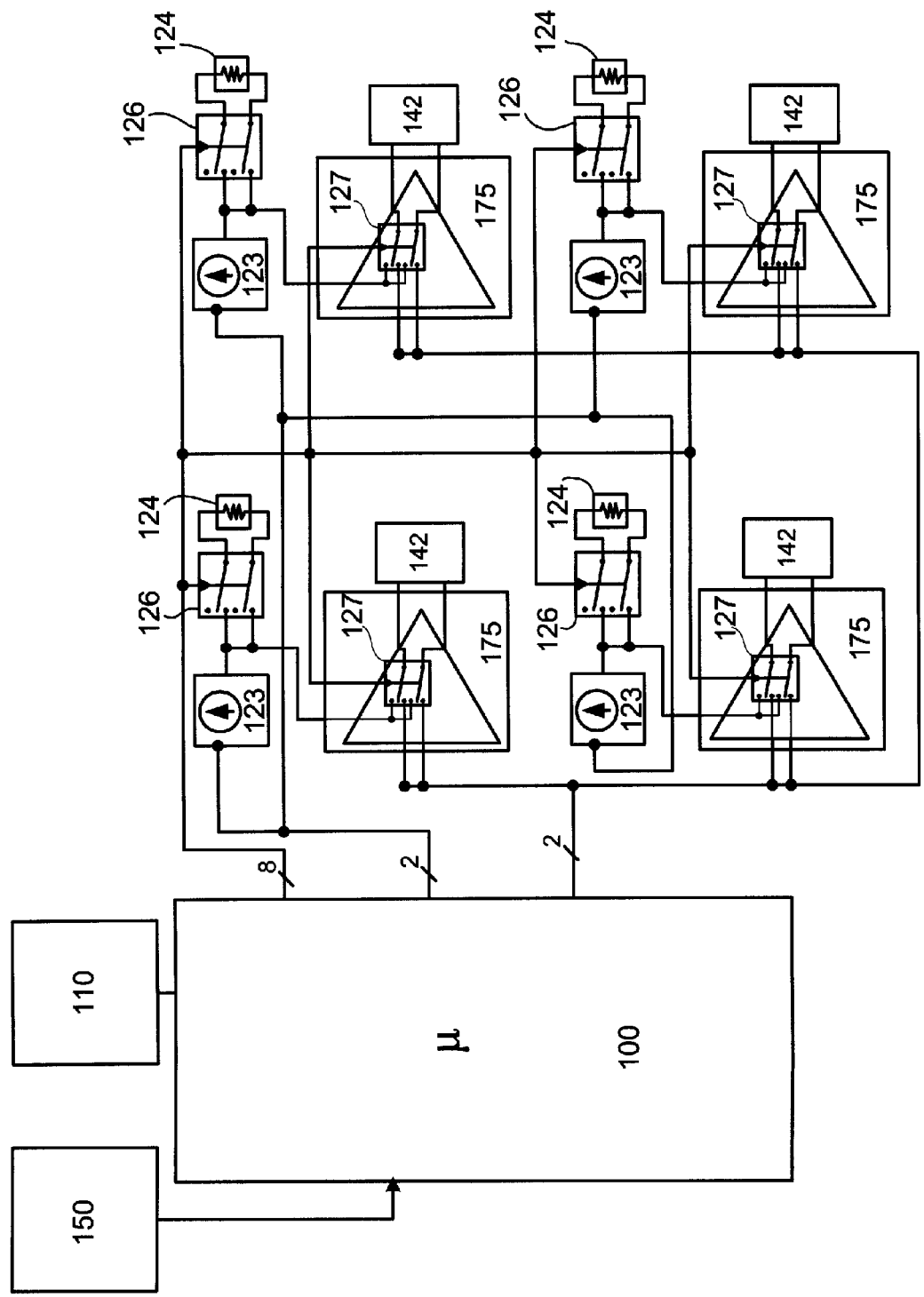

In some examples, as shown in FIG. 1D, to analyze each channel 142 separately, the bypass switches 127 in the respective amplifier ICs 175 for each channel couple the current source 123 and the processor 100 to their respective channels in turn (additional components, whether integrated or discrete, are not shown). To test the channels in parallel, as shown in FIG. 1E, additional current sources 123, switches 124, and calibration resistors 126 may be used, one for each channel. This makes integrating those components into the amplifier IC 175 advantageous, as no additional circuit components are needed outside of the ICs. In some examples, multiple channels are tested simultaneously for a combined impedance (e.g., the switches 125 (FIG. 1B) or 127 (FIG. 1D) for more than one channel couple the current source 123 to their respective channels at the same time). This is useful for identifying the system 140 as a whole and for identifying situations where channels are coupled outside of the amplifier. For example, in some vehicles, the left front and right front channels are coupled together using a passive crossover to create an artificial center channel signal for a center speaker. Testing the combined impedance of the channels allows detecting this situation so that the correct equalization will be loaded.

Similarly to integrating components into the amplifier IC, one or more instances of the current source 123, switch 124, and calibration resistor 126 may be implemented in the processor 100. In another example, to analyze the entire electroacoustic transducer system 140, a single switch 125 or a combination of switches couple the current source and the processor to two or more channels 142 concurrently (in series or in parallel, depending on the topology and capabilities of the system), and the total system impedance is measured.

Figure 2A:
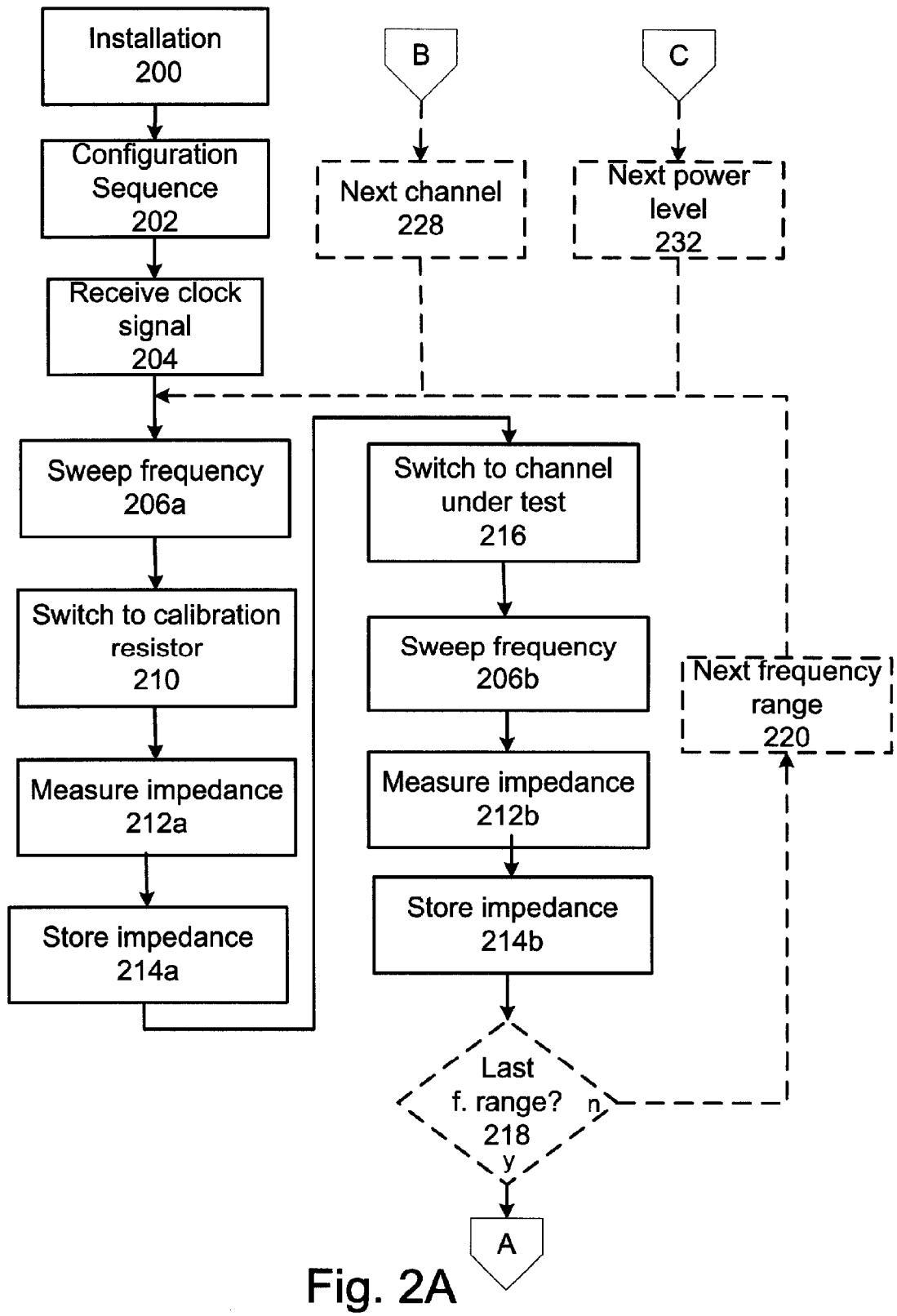
FIGS. 2A-2B are a flow chart of one example of the installation and operation of the entertainment system in FIG. 1A.
Figure 2B:
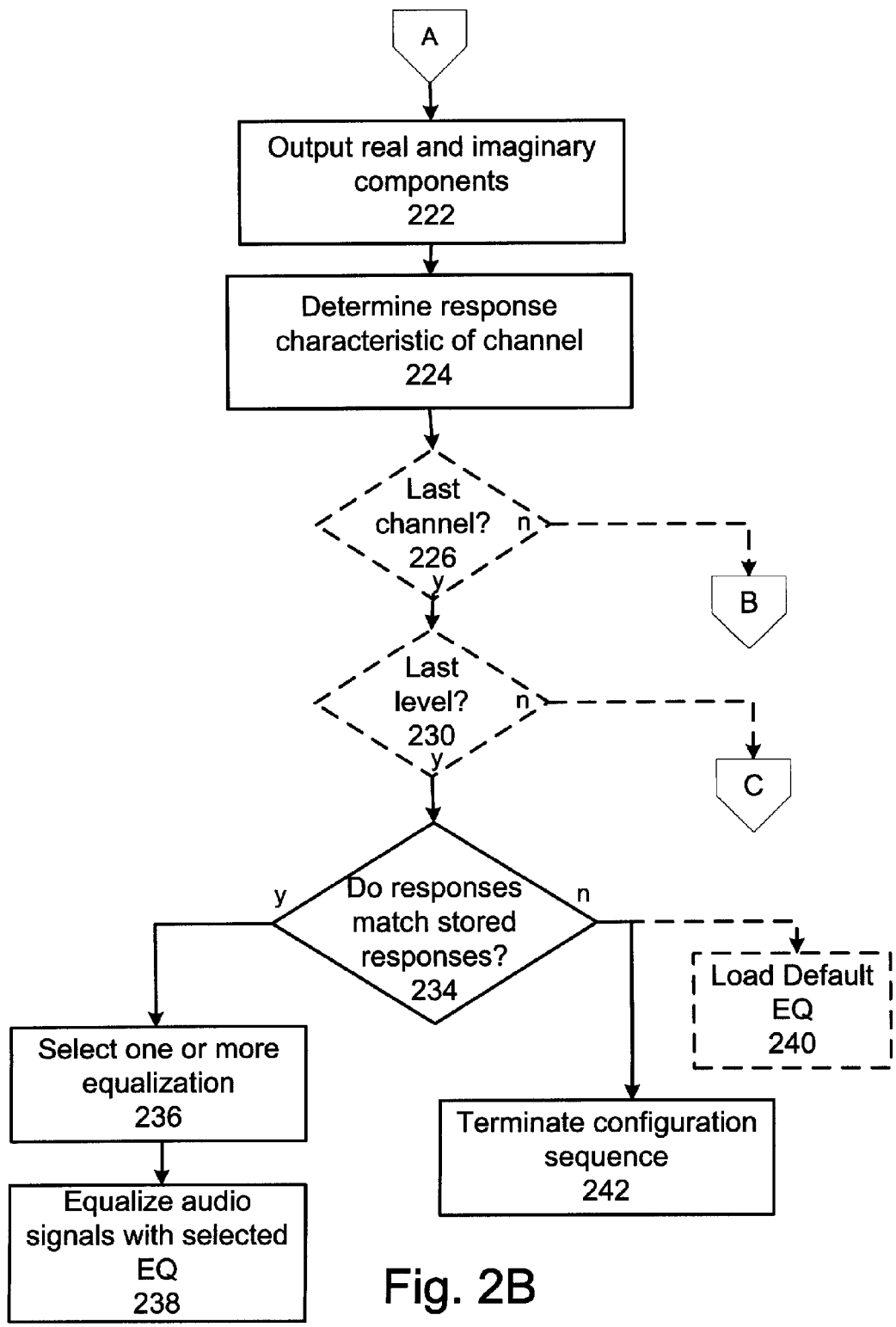

FIGS. 2A and 2B illustrate one example of the installation and operation of the entertainment system. The amplifier 190 or other component including the processor 100, detecting circuit 120, and related circuits is installed (200) into the vehicle. The configuration sequence is initiated (202) either automatically or by the user. A clock signal is received (204) and used to sweep (206a) a sinusoidal signal through a series of frequencies, as explained above, covering a full range of the audible spectrum.

The switch 124 connects (210) the current source 123 to the calibration resistor 126 to provide a calibration standard to compensate the magnitude and phase characteristics of the entertainment system while taking a unit-to-unit response variance into consideration. When multiple frequency bands are tested, calibration is performed for each band. The impedance to digital converter measures (212a) the complex impedance of the load across its output terminals for each frequency in the band. After measuring and storing (214a) the complex impedance of the calibration resistor, the switch 125 or 127 couples (216) the current source 123 to the channel under test. The frequency sweep is repeated (206b) and the complex impedance of the channel at each frequency is measured (212b) and stored (214b). In some examples, the impedances of the calibration resistor and channel under test are measured iteratively through multiple ranges of the audible spectrum (218, 220). This has the advantage of providing greater resolution in the measured impedance.

The impedance to digital converter outputs (222) data representing real (R) and imaginary (I) components of the measured complex impedance at a given frequency to the processor 100. In examples where measurements other than complex impedance are used, the steps of measuring, storing, and outputting complex impedance are modified to measure, store, and output the measured values. The processor 100 determines (224) a response characteristic of the channel from the inputted values (in some examples, the inputted values, such as complex impedance, represent the response characteristic without any further computation). If the channels are being tested serially, the process repeats (226, 228) for each channel. In some examples, the system is tested at multiple power levels (230, 232), for reasons explained below. After all the channels have been measured at all power levels, the processor determines (234) whether the response characteristics match at least one stored set of response characteristics in the memory 110. If a match is found, the processor selects (236) one or more equalizations corresponding to the stored response characteristic, where the stored response characteristic matches the measured response characteristic of the channel. The audio signal outputted from the source 150 to each channel 142 is equalized (238) using the selected equalizations. In some examples, this is performed by loading the selected sets of equalization coefficients (one set for each channel) into the equalization memory 115 of the processor 100. If no match is found, a default equalization may be loaded (240). Alternatively, if the system does not provide a default equalization, the processor terminates (242) the configuration sequence and reports an error if no stored response characteristic matches the response characteristic of the channel. In another example, where no stored response characteristic matches the response characteristic of the channel, the processor identifies an incorrectly installed or damaged electro-acoustic transducer or transducer enclosure.

In some examples, the signal provided from the hands-free microphone to the communication system is equalized (238) using another selected equalization.

In some examples, the measurement (212a or 212b) includes exciting the load (i.e., the calibration resistor 126 or the one or more electro-acoustic transducers 160 and 162 in the channel 142) with a selected frequency for a given number of whole sinusoid cycles prior to beginning measurement. Where there is a large Q factor (the comparison of the frequency to the rate of dissipation of energy), more cycles are needed for settling prior to conducting an accurate measurement. Although reduced cycles may degrade the precision of the measurements, especially near resonance, a high repeatability and accuracy can be maintained while shortening the overall scan time by taking the reduced number of cycles and Q value of the electro-acoustic transducer into account when constructing the stored response characteristic.

In one example, to improve data collection, the processor 100 maintains the DC bias of the excitation signal between frequency sweeps in the iterative frequency scan when measuring the impedance in a channel having an electro-acoustic transducer with a DC blocking capacitor. Alternatively, in another example, the collection of data is delayed for a sufficient amount of time to ensure that the DC blocking capacitor has been completely biased and the system has entered a steady state after the initiation of the excitation signal. In another example, as mentioned above, the processor 100 iteratively measures the impedance of each channel 142 at different signal power levels. This allows the processor to determine whether the measured channel has the same complex impedance frequency response curve at each signal power level over the tested range of frequencies, providing an additional measure for identifying or diagnosing transducers. Testing at multiple power levels provides greater differentiation between similar transducer models and improved identification of defects or damage to transducers. Higher signal levels cause greater excursion by the moving parts of the one or more electro-acoustic transducers in the channel being analyzed. This greater excursion helps improve the detection of damage or subtle differences between electro-acoustic transducers. In some examples, the greater excursion caused by higher signal levels is enough to cause the moving parts of the transducer to contact surrounding materials, such as a speaker grille installed over the transducer, changing the impedance response characteristic and helping to identify the nature of the surrounding materials or to determine, for example, that a grille is or is not present. Other factors that affect the response characteristic include resonances that are reflected back to the moving parts of the transducer and that can alter the transducer's motion. For example, standing waves inside a transducer's enclosure show up as a peak followed by a dip with a sharp transition. Standing waves outside the transducer enclosure, such as room modes in the vehicle, may also show up this way. If such effects are expected, they are included in the stored response characteristics and help determine that the transducer's enclosure has not been modified. Conversely, if an enclosure has been modified, its effects will not be in the stored response characteristic and a match will not be made.

We now explain one example of how the response characteristic of the tested transducer is determined and compared to the known response characteristics in the memory. The magnitude ($M_i$) and phase angle ($\theta_i$) of impedance (Z) at each frequency point (i) in the full frequency scan may be determined from the real (R) and the imaginary (I) impedance data measured by the impedance to digital converter 122, where $$Z = R + jI, \tag{1}$$

$$M_i = |Z_i| = \sqrt{R^2 + I^2}, \text{ and} \tag{2}$$

$$\theta_i = \angle Z_i = \tan^{-1}(I/R). \tag{3}$$

During the calibration scan, the measured impedance for all frequency points equals the impedance ($Z_c$) of the calibration resistor 126. The gain factor ($G_{ci}$) at each point i may be calculated as $$G_{ci} = \frac{M_c}{M_i}, \qquad (4)$$

where the known impedance magnitude is $M_c=|Z_c|$. Where there is a pure resistance, the phase angle at any frequency is zero. The phase calibration $\nabla_{ci}$ may be calculated from $$\nabla_{ci} = \theta_i - \theta_c, \qquad (5)$$

where the impedance phase $\theta_c = 0$.

After performing the measurement impedance scan, the measured impedance $Z_i$ is converted into a magnitude $M_i$ and a phase angle $\theta_i$. The calibration gain factor $G_{ci}$ and phase calibration factor $\nabla_{ci}$ are used to calculate the magnitude $M_{mi}$ and the phase angle $\theta_{mi}$ of the total impedance $Z_{mi}$ of the load on the channel from the measured $M_i$ and $\theta_i$ according to the relation:

$$M_{mi} = G_{ci} M_i \qquad (6)$$

$$\theta_{mi} = \nabla_{ci} - \theta_i \qquad (7)$$

In one example, the identity of the electro-acoustic transducers supplied by the measured channel is determined by matching the response characteristic of the channel collected from the impedance scan with a stored response characteristic. When we refer to the impedance or response characteristic of the channel, we mean the response of whatever transducers or other loads are coupled to the channel. Each stored response characteristic includes, for each point i, an average magnitude ($M_{si}$) and an average phase ($\theta_{si}$). The identification of the transducers is aided by comparing both the magnitude and phase, such that, for example, when the magnitude has no apparent change between the stored response and the measured response of an incorrect or damaged transducer, the phase still changes, or when the phase has no apparent change, the magnitude still changes. In some examples, the stored response characteristics are determined by averaging detected response characteristics for a given number of electro-acoustic transducers over a sufficient sample, for example six samplings. In some examples, a stored response characteristic is represented by a parameterized model of the transducer, which may be derived from the design of the transducer or may itself be based on detected response characteristics of sample transducers. The $M_{si}$ and $\theta_{si}$ values for each point i are then computed on demand, rather than stored in memory.

In some examples, a modified Reduced Chi-square Goodness of Fit Test is used to compare the response characteristic of the channel to a plurality of stored response characteristics to determine which stored response characteristic, if any, is the best match. To facilitate using this test, each stored response characteristic includes, for each point i, a standard deviation of the magnitude ($\sigma_{Msi}$) and a standard deviation of the phase ($\sigma_{\theta si}$), as well as a maximum allowed Chi-square value for magnitude ($X^2_{Ms-max}$), and a maximum allowed Chi-square value for phase ($X^2_{\theta s-max}$). The maximum allowed Chi-square values, $X^2_{Ms-max}$ and $X^2_{\theta s-max}$, and the standard deviations, $\sigma_{Msi}$ and $\sigma_{\theta si}$, are a measure of how much variation is allowed between the stored response and the measured response in order to find a match. For example, where only small variations are allowed, $X^2_{Ms-max}$, $X^2_{\theta s-max}$, $\sigma_{Msi}$ and $\sigma_{\theta si}$ will be lower. Where larger variations are allowed, for example, because there is great variability between nominally identical transducers, $X^2_{Ms-max}$, $X^2_{\theta s-max}$, $\sigma_{Msi}$ and $\sigma_{\theta si}$ will be higher. In some examples, the $X^2_{Ms-max}$ and $X^2_{\theta s-max}$ values are constant, for example 2N, where N is the total number of samples (discrete frequencies in the sweep, for the impedance example), rather than specific to each stored response.

The Reduced Chi-square Goodness of Fit Test, modified to allow for a variable $\sigma$, is defined as:

$$X^2 = \sum_{i=1}^{N} \left( \frac{y_{si} - y_{mi}}{\sigma_{si}} \right)^2, \qquad (8)$$

where $y_{si}$ is the stored response characteristic, $y_{mi}$ is the response characteristic of the electro-acoustic transducer, and $\sigma_{si}$ is the standard deviation of the stored response characteristic at each point i. The standard deviation $\sigma_{si}$ is defined as:

$$\sigma_{si} = \sqrt{\frac{1}{N} \sum_{j=1}^{N} (y_{sij} - \overline{y_{sij}})} \qquad (9)$$

where $\overline{y_{sij}}$ is the mean of $y_{sij}$:

$$\overline{y_{sij}} = \frac{1}{N} \sum_{j=1}^{N} y_{sij}. \qquad (10)$$

The Chi-square values for the magnitude and phase are defined as:

$$X_M^2 = \sum_{i=1}^{N} \left( \frac{M_{si} - M_{mi}}{\sigma_{Msi}} \right)^2 \qquad (11)$$

$$X_\theta^2 = \sum_{i=1}^{N} \left( \frac{\theta_{si} - \theta_{mi}}{\sigma_{\theta si}} \right)^2. \qquad (12)$$

To determine whether the response characteristic of the channel matches one or more stored response characteristics, the $X_M^2$ and $X_\theta^2$ values are calculated for each stored response characteristic and compared to the corresponding $X^2_{Ms-max}$ and $X^2_{\theta s-max}$, values. If both the calculated values $X_M^2$ and $X_\theta^2$ for a given stored response characteristic are below the maximum values $X^2_{Ms-max}$ and $X^2_{\theta s-max}$ of that stored response characteristic, there is a match. Where the $X_M^2$ and $X_\theta^2$ are both below the $X^2_{Ms-max}$ and $X^2_{\theta s-max}$ values, respectively, of exactly one of the stored response characteristics, that stored response characteristic identifies the one or more electro-acoustic transducers 160, 162 in the channel 142. In cases where the response characteristic of the channel matches more than one of the stored response characteristics for both $X_M^2$ and $X_\theta^2$ (i.e., $X_M^2$ and $X_\theta^2$ computed for more than one stored response characteristic are both less than the corresponding $X^2_{Ms-max}$ and $X^2_{\theta s-max}$ values), the combined values of $X_M^2 + X_\theta^2$ for each candidate response characteristic are compared. The stored response characteristic giving the lowest combined value of $X_M^2 + X_\theta^2$ is the correct match and identifies the set of one or more electro-acoustic transducers 160 in the channel 142.

The measured response characteristic of each channel is compared to the stored response characteristics. The combination of identified transducers in all channels is used to identify the vehicle. In some examples, more than one vehicle or more than one model of a single vehicle use the same configuration of transducers, but different sets of equalizations or other settings should be used for each. Differences in the vehicles may affect the impedance response characteristic, allowing the process described above to differentiate between vehicles. If impedance is inconclusive, additional information may be acquired, such as a total transfer function measured acoustically, as described below. In some examples, the processor 100 prompts the user through the user interface 130 to select a vehicle model from a menu displaying the vehicle models having the identified configuration of transducers.

In another example, where the response characteristic of the channel has no matching stored response characteristic (because one or both of $X_M{}^2$ and $X_\theta{}^2$ exceed the corresponding $X_{Ms\text{-}max}{}^2$ and $X_{\theta s\text{-}max}{}^2$ for every stored response characteristic), the processor concludes that an unknown or damaged electro-acoustic transducer has been connected in the electro-acoustic transducer system 140. In this case, the processor terminates the configuration sequence and identifies the unknown or damaged electro-acoustic transducer. In another example, where the measured impedance of the channel is skewed by a damaged transducer housing and the processor is able to determine that this is the reason for a failure to match any stored response characteristic, the processor identifies the damaged transducer housing. In some examples, the transducers present in each channel are identified, but the combination of transducers does not match any known vehicle model. Similarly, in some examples, the response characteristic of one or more of the channels is sufficient to determine the type of transducer (e.g., bass vs., tweeter, 6"×9" vs. 5" round), but not a model. In these examples, the processor may load a default equalization for each channel based on the type of speaker. This avoids distortion by not providing audio signals outside of the playable range of each transducer, even when an optimized equalization for the vehicle is not available. Other methods of comparing impedance measurements may be used, such as comparing the magnitude of the difference between measured and modeled curves, but we have found that the modified Reduced Chi-square Goodness of Fit Test described above advantageously helps differentiate between different models of electro-acoustic transducers.

In some examples, other sources of measurement are used to identify the transducers alone or in combination with the impedance measurement described above. In one example, illustrated in FIG. 3, an input electro-acoustic transducer 320, for example a microphone or similar acoustic sensor, is positioned in a listening volume 380 and coupled to the processor 100. The input transducer 320 is used to measure an acoustic transfer function of the vehicle interior. Aspects of the transfer function are used to create a signature of the interior that is matched to stored signatures. As with the impedance measurement, in some examples the signature is the raw data describing the transfer function and in some examples the signature is descriptive data derived from the raw data. The processor 100 is coupled to the source 150, the memory 110 and one or more amplification circuits 170 as in the example of FIG. 1A. As in FIG. 1A, each channel 142 may have one (as shown) or more electro-acoustic transducers 160. In some examples, the microphone 320 is housed within the head unit, while in other examples, it is separately mounted within the listening volume 380, for example, in the rear-view mirror or in the headliner of the vehicle. In another example, the processor 100 is coupled to a second input electro-acoustic transducer, for example, some vehicles have more than one hands-free microphone or both a hands-free microphone and a noise-cancellation microphone. In some examples, the sensor 320 is located in the listening volume 380 only during the setup stage and is subsequently removed. For reliable matching of raw data of measured and stored responses, the microphone should be in the same position when measuring as it was when generating the data for the stored responses. Alternatively, any differences between the positions should be known and accounted for. Locating the microphone in a component having a fixed location, such as the head unit, provides such a controlled location. In some examples, where the microphone is not fixed to the vehicle, it may be positioned in a known and repeatable position through the use of a test fixture. In some examples, using a "signature" of the transfer function alleviates the need for consistent placement of the microphone.

In one example of the operation of the entertainment system illustrated in FIG. 3, the processor 100 triggers the electro-acoustic transducer system 140 or individual channels 142 to generate a test sound in the listening volume 380 in an automatic or user-initiated configuration sequence. The microphone 320 senses the test sound and delivers it to the processor 100. The processor receives the measured sound from the microphone 320 and computes a response characteristic, such as the acoustic transfer function, of the one or more electro-acoustic transducers 160 in the channel 142 being tested in combination with the listening volume 380. The processor determines whether the response characteristic matches at least one stored response characteristic. This comparison may use the Chi-square comparison technique described above, substituting measurements based on the complex transfer function from the channel 142 to the input transducer 320 for the impedance measurements used in equations (8) through (12), or another suitable technique for comparing transfer functions of an audio system in a listening environment. Each stored response characteristic corresponds to a known environment, where the known environment corresponds to a known set of one or more electro-acoustic transducers in a channel and the effect on output of that channel by a known vehicle interior, i.e., the total transfer function of audio signals from the electro-acoustic transducer inputs, through the vehicle interior, to the microphone output. The processor 100 selects one of a plurality of equalizations stored in the memory 110 to equalize a signal sent from the source 150, through the processor 100 and the amplification circuits 170, to each channel 142. Each equalization corresponds to at least one stored response characteristic and includes sets of equalization coefficients for each channel or for the input microphone, as described above.

Figure 4:
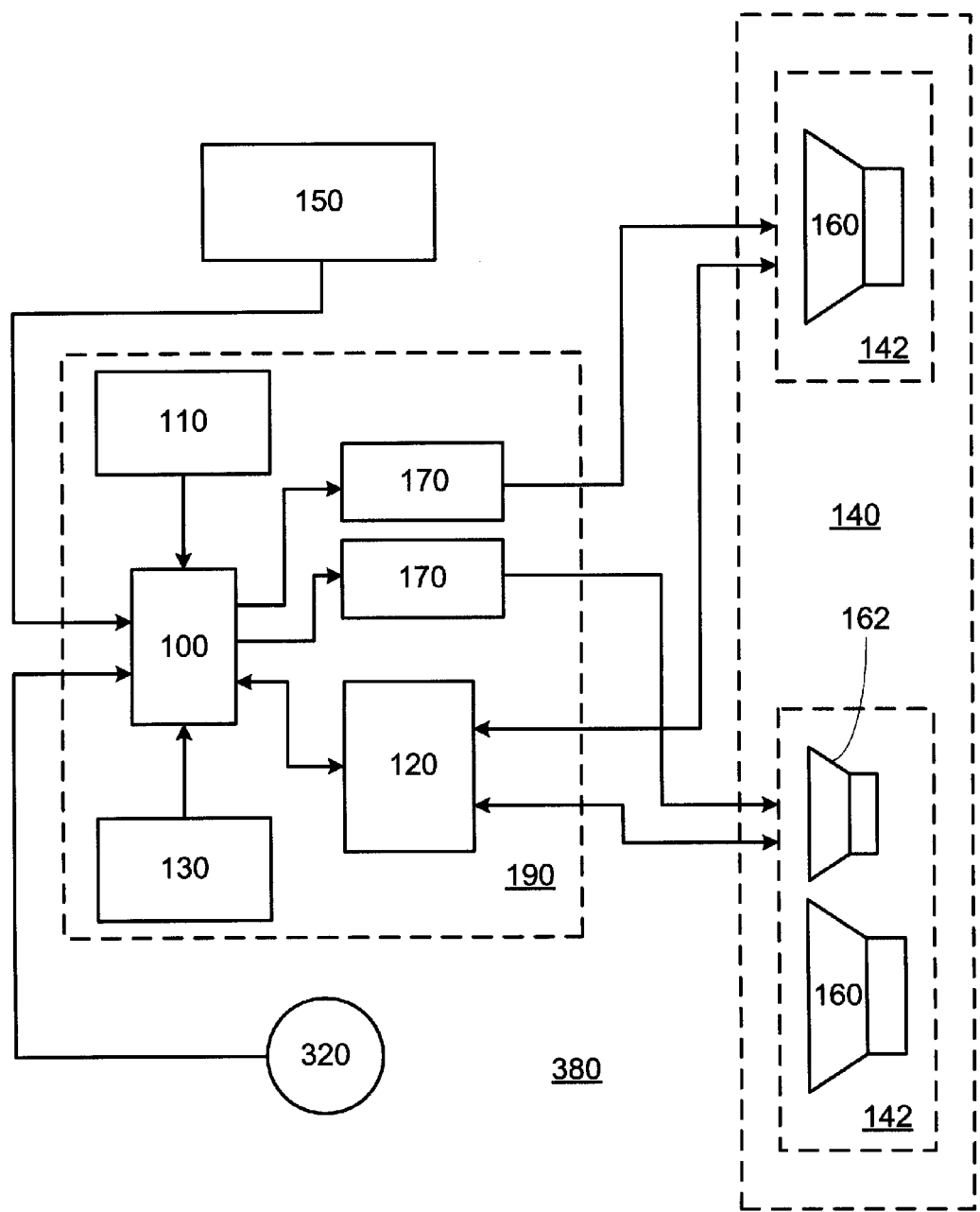

In one example, shown in FIG. 4, the entertainment system combines the systems from the examples of FIGS. 1A and 3. The processor 100 is coupled to the source 150, the memory 110, the user interface 130, one or more amplification circuits 170, the detecting circuit 120 and the input electro-acoustic transducer 320, for example a microphone, in the same manner as in the examples in FIGS. 1A and 3. Such a combined system is useful in situations where the identification of the transducers alone may be insufficient to unambiguously identify the set of equalization coefficients to be used, such as where identical audio systems are installed in a vehicle with varying interior materials, such as cloth or leather seats, or varying configurations, such as sedan or wagon.

The processor 100 uses the detecting circuit 120 to determine a first response characteristic, for example an electrical impedance response characteristic, of the transducers 160 as in the example of FIG. 1A. To provide greater accuracy in identifying the transducers and the vehicle acoustic environment (e.g., whether the vehicle has cloth or leather seats), the microphone 320 senses a test sound output by the transducers 160 and the processor 100 determines a second response characteristic, for example an acoustic response characteristic, as in the example in FIG. 3. The test sound may be a sound produced incidentally while testing the impedance of the transducers or it may be separately produced in an additional testing step. For example, the acoustic environment may be tested using pink noise to measure the magnitude of the acoustic response while the sounds produced during the impedance testing may produce only a single frequency at a time. The processor 100 determines whether the first response characteristic and second response characteristic together match at least one stored total or combination response characteristic. Each stored response characteristic corresponds to known set of one or more electro-acoustic transducers in each channel of a known vehicle interior. The processor 100 selects one of a plurality of equalizations stored in the memory 110 to equalize the signals sent from the source 150, through the processor 100 and the amplification circuits 170, to each channel 142. In some examples, the processor 100 selects an equalization to equalize a signal sent from the hands-free microphone to the communication system.

Figure 5:
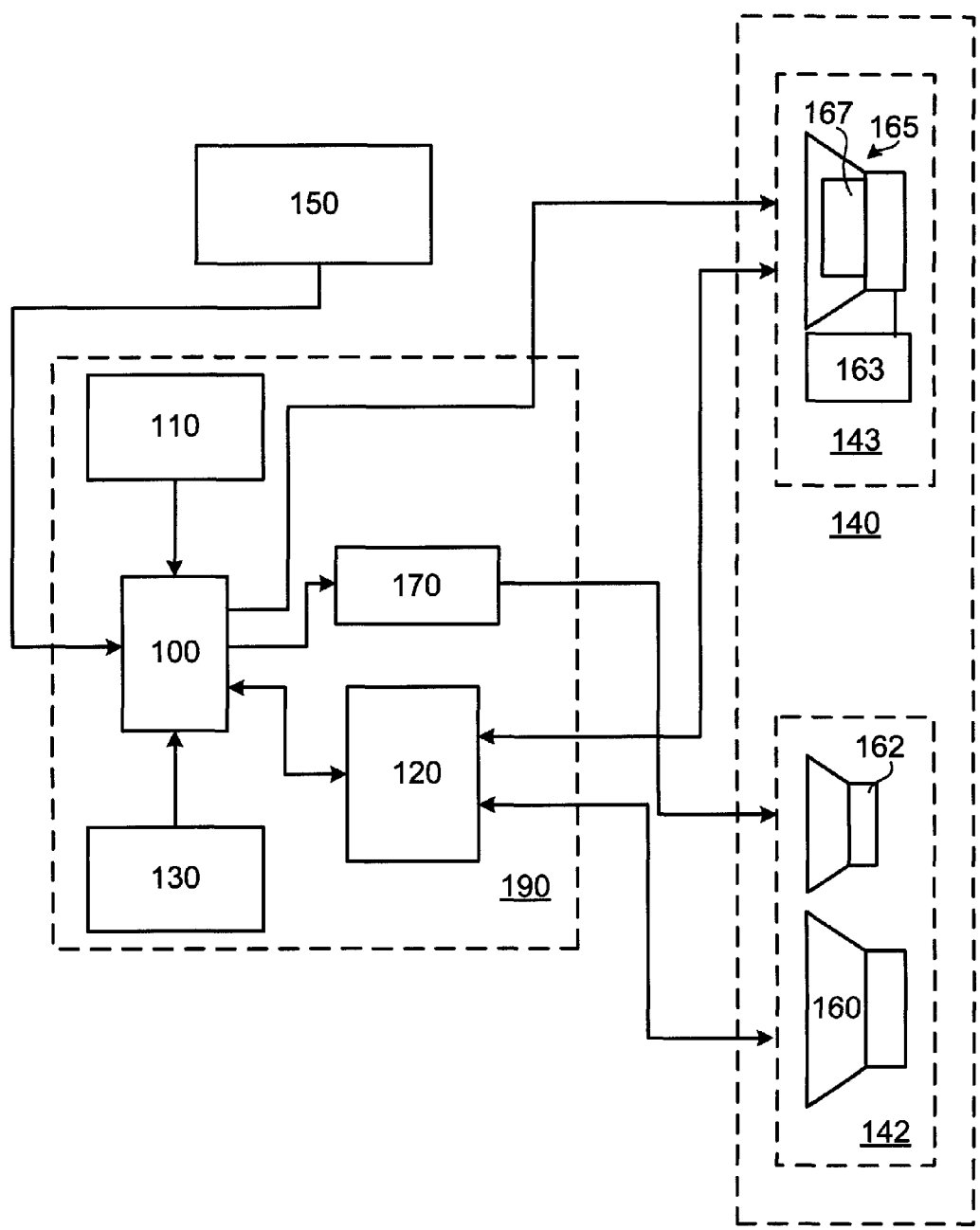

In one example, shown in FIG. 5, the entertainment system combines the system from the example in FIG. 1A with at least one external amplifier 163 or electro-acoustic transducer 165 having a self-contained amplification circuit 167 on an amplified channel 143. Such an amplified channel is used, for example, to provide a powered bass box in a vehicle or to allow more amplified channels than a stock amplifier provides. The processor 100 is coupled to the source 150, the memory 110, the user interface 130, one or more amplification circuits 170 and the detecting circuit 120 as in the example in FIG. 1A. Line-level audio signals are provided from the processor to the amplified channel 143. The detecting circuit 120 is coupled both to the unamplified channel 142, as described above, and to the amplified channel 143. (The channel 142 is unamplified from the point of view of the detecting circuit 120, as the amplification circuits 170 are disconnected from corresponding channels 142 when the measurements are made.)

In operation, the processor 100 uses the detecting circuit 120 to determine a response characteristic of each channel, i.e., the response of the one or more transducers in each unamplified channel 142 and the amplifier 163 or 167 in the amplified channel 143. The processor 100 receives the sensed response characteristic from the detecting circuit 120 and determines whether the sensed response characteristic matches at least one stored response characteristic as in the example in FIG. 1A. Each stored response characteristic corresponds to a known load, where the known load corresponds to a known amplification circuit or a known electro-acoustic transducer (or combination of transducers in a single channel). The processor 100 selects one of a plurality of equalizations stored in the memory 110 to equalize the signal sent from the source 150, through the processor 100, to each channel 142 and 143.

Such an arrangement is useful, for example, in situations where the identification system is installed concurrently with an electro-acoustic transducer having a self-contained amplification circuit. The identification system detects whether both (a) the expected stock transducers are present and undamaged, and (b) the accompanying amplified transducer has been installed and connected properly. An appropriate set of stored equalizations are loaded if the amplified transducer is present, and another set is loaded (or an error produced) if it is not. If it is desired to detect whether the amplified transducer is installed in a particular location, additional acoustic measurements may be needed as described above. Such a system is also useful with factory systems having stock external amplifiers, if the identity of the amplifier is a reliable indicator of the identity of the transducers connected to it, possibly in combination with other channels where the transducers can be directly identified.

Embodiments may use any of numerous known techniques for measuring response characteristics of electro-acoustic systems and components. Techniques using excitation signals such as swept sine waves, chirp signals, MLS sequences, pseudo random noise, or any other signal type useful for measuring the complex transfer function of electro-acoustic systems can be used.

Figure 6:
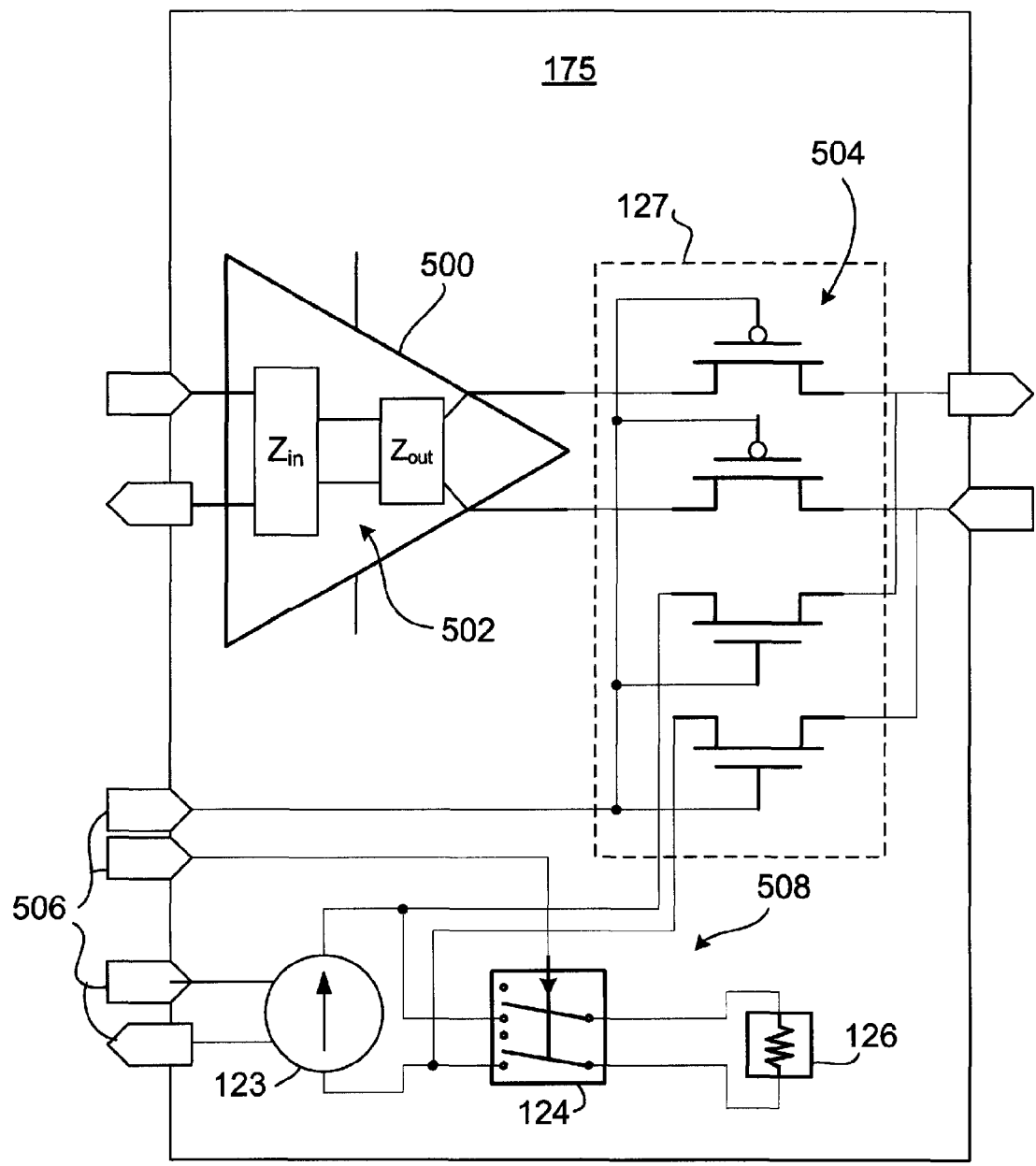
FIG. 6 is a block diagram of an integrated circuit.

As mentioned above, the function of the switch 125 may be integrated into the power amplifier circuit 170 to form a new circuit 175, as shown schematically in FIG. 6. In the case of a power amplifier integrated circuit (IC) 500 that consists of numerous components 502 (shown schematically, not to represent any particular amplifier circuit implementation) including transistors, capacitors, and resistors, for example, in a semiconductor material such as silicon, the few additional circuit components 504 and external connections 506 needed to implement the un-amplified pass-through provided by the switch 127 provide the power amplifier IC with a useful new feature for minimal increased fabrication cost, if any. The particular circuit shown in FIG. 6 is for illustration only. Specifics of any given implementation, such as the semiconductor technology used and the operating conditions of the device will determine the details of such a circuit. An un-amplified pass-through that allows the testing circuit on one side full exposure to the load on the other side allows the impedance testing described above as well as other useful operations, such as low-power communication with the load. The impedance of a load on an amplifier 500 can not normally be tested from the input side because the input impedance $Z_{in}$ is decoupled from load, and the output impedance $Z_{out}$ is decoupled from the input. Whereas, a switched pass-through that uses the same load terminals allows testing of the load impedance. The further addition of circuitry 508 (shown schematically, not to represent any particular circuit implementation) to integrate the current source 123, switch 124, and calibration resistor 126 provide still more added benefits for, again, minimal increased fabrication cost. With this addition, the single IC 175 provides feedback on the load that the processor 100 (FIGS. 1A-1D) can use to determine its impedance.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. Additionally, it should be understood by one of skill in the art that signals may be executed in an analog or digital format. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the present invention.

Having thus described at least illustrative embodiments of the invention, various modifications and improvements will readily occur to those skilled in the art and are intended to be within the scope of the invention. For example, although the examples illustrated in the figures illustrate an entertainment system, the teaching described may be applied to any system having one or more unknown electro-acoustic transducers. Accordingly, the foregoing description is by way of example only and is not intended as limiting. The invention is limited only as defined in the following claims and the equivalents thereto.

What is claimed:

1. An integrated circuit comprising a power amplification circuit;

a first switch circuit coupled to an output of the power amplification circuit, a bypass input, and a control input, such that the switch selectively couples the power amplification circuit output or the bypass input to an output of the integrated circuit;

a current source coupled to the bypass input;

a calibration resistor; and a second switch coupled to the current source, the calibration resistor, and a second control input such that the second switch selectively couples the current source to the calibration resistor.

* * * * *